(12) United States Patent
Lee et al.

(10) Patent No.: US 8,570,476 B2
(45) Date of Patent: Oct. 29, 2013

(54) LIQUID CRYSTAL DISPLAY DEVICE HAVING THE SAME OPENINGS AND MANUFACTURING METHOD THEREOF

(75) Inventors: Kyung Ha Lee, Gyeongsangnam-do (KR); Sang Hun Han, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 236 days.

(21) Appl. No.: 12/535,097

(22) Filed: Aug. 4, 2009

(65) Prior Publication Data

US 2010/0134744 A1 Jun. 3, 2010

(30) Foreign Application Priority Data

Dec. 3, 2008 (KR) .......................... 10-2008-0121576

(51) Int. Cl.
*G02F 1/1343* (2006.01)

(52) U.S. Cl.
USPC ........................................................... 349/141

(58) Field of Classification Search
USPC ........................................................... 349/141
See application file for complete search history.

(56) References Cited

U.S. PATENT DOCUMENTS

| | | | |
|---|---|---|---|
| 2001/0005252 A1* | 6/2001 | Lee et al. ....................... | 349/141 |
| 2001/0007779 A1* | 7/2001 | Lee et al. ......................... | 438/30 |
| 2004/0051834 A1* | 3/2004 | Lee .................................. | 349/141 |
| 2004/0212761 A1* | 10/2004 | Kadotani et al. ................ | 349/110 |
| 2007/0296901 A1* | 12/2007 | Seo et al. ........................ | 349/141 |
| 2008/0094559 A1* | 4/2008 | Lee et al. ........................ | 349/143 |

\* cited by examiner

*Primary Examiner* — Lauren Nguyen
(74) *Attorney, Agent, or Firm* — Morgan, Lewis & Bockius LLP

(57) ABSTRACT

An LCD device and a manufacturing method thereof having improved transmittance and contrast ratio are disclosed.
According to the LCD device and the manufacturing method thereof, a first common electrode which includes first and second horizontal electrode bars and a plurality of first vertical common electrode bars is disposed on a layer different from a second common electrode which includes a third horizontal common electrode bar and a plurality of second vertical common electrode bars. A pixel electrode which includes a horizontal pixel electrode bar and a plurality of vertical pixel electrode bars is disposed on the same layer as the second common electrode. The second common electrode is connected to the first common electrode.

15 Claims, 11 Drawing Sheets

LIQUID CRYSTAL DISPLAY DEVICE HAVING THE SAME OPENINGS AND MANUFACTURING METHOD THEREOF

CROSS-REFERENCE TO RELATED APPLICATION

This application claims priority under 35 U.S.C. 119 to Korean Patent Application No. 10-2008-0121576, filed on Dec. 3, 2008, which is hereby incorporated by reference in its entirety.

BACKGROUND

1. Field of the Disclosure

This disclosure relates to a liquid crystal display device with improved transmittance and contrast ratio, and a driving method thereof.

2. Description of the Related Art

As the information society grows, flat display devices capable of displaying information have been widely developed. These flat display devices include liquid crystal display (LCD) devices, organic electro-luminescence display (OLED) devices, plasma display devices, and field emission display devices. Among the above display devices, LCD devices have the advantages that they are light and small and can provide a low power drive and a full color scheme. Accordingly, LCD devices have been widely used for mobile phones, navigation systems, portable computers, televisions and so on.

LCD devices control the transmittance of a liquid crystal on a liquid crystal panel, thereby displaying a desired image. LCD devices generally have a poor viewing angle.

In order to improve the viewing angle, an LCD device with an in-plane switching (IPS) mode has been proposed which generates a horizontal electric field or an in-plane electric field by means of pixel electrode and common electrode arranged on the same substrate. Also, the pixel and common electrodes included in the LCD device of the IPS mode have been designed to be arranged in one of several configurations, including a one-matal-one-ITO (1-metal-1-ITO), a two-ITO (2-1TO), and a 2MoTi configuration.

Among these electrode arrangement configurations, the 1-metal-1-ITO configuration includes common electrodes 103a and 103b and a pixel electrode 107 arranged on different layers, as shown in FIG. 1. The common electrodes 103a and 103b, which include a metal film, are disposed on a substrate 101. Meanwhile, the pixel electrode 107, which includes a transparent conductive film such as an ITO film is disposed on a passivation (or protective) film 106.

The 1-metal-1-ITO configuration uses a mask in the formation of the common electrodes 103a and 103b. The mask can be aligned in an undesired position which is then shifted from a desired position to one direction (for example, to the right side of the desired position) during the formation of the common electrodes 103a and 103b. In other words, a mask misalignment can be generated. In this case, shifted common electrodes 105a and 105b may be formed. The shifted common electrodes 105a and 105b are separated in differing distances from the pixel electrode 107. More specifically, a first region A defined between the first shifted common electrode 105a and the pixel electrode 107 is of a width narrower than that of a second region B formed between the second shifted common electrode 105b and the pixel electrode 107. As such, the transmittances of the first and second regions A and B with regards to the same voltage are different from each other, thereby deteriorating the overall (or general) transmittance as shown in FIG. 2.

The 2-ITO configuration includes a pixel electrode 113 and a common electrode 115 arranged on the same layer, i.e., on the surface of a substrate 111, as shown in FIG. 3A. The pixel electrode 113 and the common electrode 115 are formed of the same material such as ITO.

In the 2-ITO configuration, an equipotential is formed on the pixel electrode 113 and the common electrode 115. As such, a mean efficiency of a liquid crystal positioned above the pixel electrode 113 and the common electrode 115 is decreased as shown in FIG. 3B. Likewise, the transmittance of the pixel region is lowered. Therefore, the contrast ratio is deteriorated.

Similarly, the 2MoTi configuration includes a pixel electrode 123 and a common electrode 125 arranged on the same layer, i.e., on a substrate 121, as shown in FIG. 4A. The pixel electrode 123 and the common electrode 125 are made of the same material such as MoTi.

As the pixel and common electrodes 123 and 125 made of MoTi are opaque, light can not penetrate through the pixel and common electrodes 123 and 125, as shown in FIG. 4B. In other words, the aperture of the pixel region is lowered. Accordingly, the light transmittance and brightness are deteriorated.

BRIEF SUMMARY

Accordingly, the present embodiments are directed to an LCD device that substantially obviates one or more of problems due to the limitations and disadvantages of the related art, and a manufacturing method thereof.

An object of the present embodiment is to provide an LCD device capable of improving both its transmittance and contrast ratio, and a manufacturing method thereof. This LCD device achieves such improvements by arranging a common electrode on the same layer as a pixel electrode and a layer different from the pixel electrode.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, an LCD device includes: a gate line disposed along a first direction; a data line crossing the gate line along a second direction; a thin film transistor disposed on the gate line and connected to the gate line and the data line; a first common electrode disposed on the same layer as the gate line and including first and second horizontal electrode bars and a plurality of first vertical common electrode bars; a second common electrode disposed on a layer different from the first common electrode and including a third horizontal common electrode bar and a plurality of second vertical common electrode bars; and a pixel electrode disposed on the same layer as the second common electrode and including a horizontal pixel electrode bar and a plurality of vertical pixel electrode bars, wherein the second common electrode is connected to the first common electrode and disposed to overlap the first common electrode.

An LCD device manufacturing method according to another aspect of the present embodiment includes: forming a gate line and a first common electrode, which includes first and second horizontal common electrode bars and a plurality of first vertical common electrode bars, on a substrate; forming an gate insulation film on the substrate including the gate line; forming a semiconductor layer on the gate insulation film opposite to the gate line; forming a data line and source/drain electrodes on the substrate including the semiconductor layer; forming a passivation film, which includes a contact hole exposing the second horizontal common electrode bar, on the substrate including the data line; and forming a pixel electrode, which includes a horizontal pixel electrode bar and a plurality of vertical pixel electrode bars, and a second common electrode which includes a third horizontal common electrode bar and a plurality of second vertical common electrode bars, on the passivation film, wherein the third horizontal common electrode bar is connected to the second horizontal common electrode bar through the contact hole.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
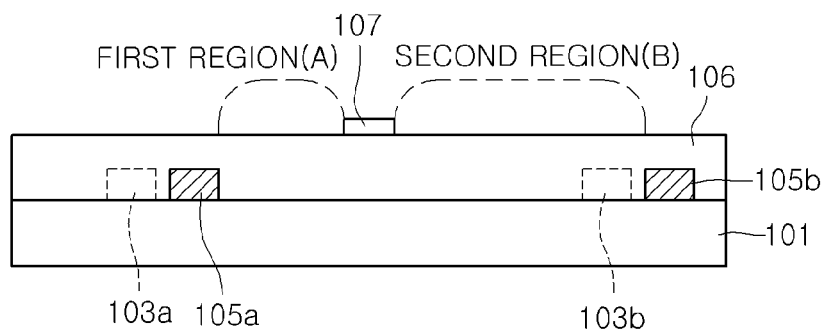
FIG. 1 is a view showing an LCD device of the 1-metal-1-ITO configuration according to the related art.
Figure 2:
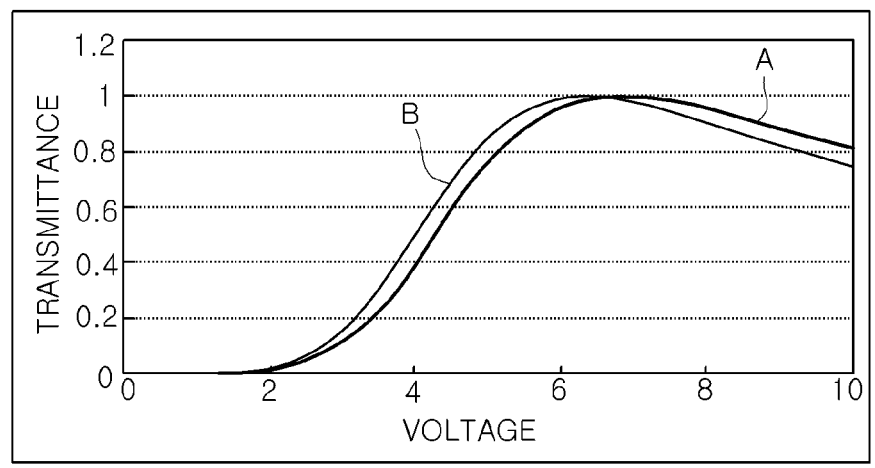
FIG. 2 is a graphic diagram showing light transmittance in an LCD device of FIG. 1 manufactured with a mask misalignment.
Figure 3A:
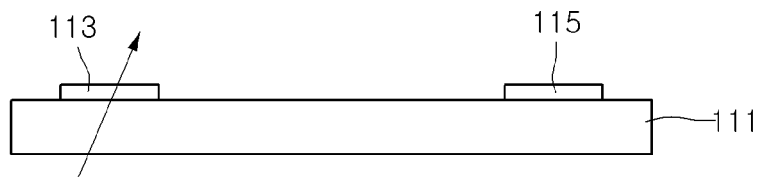
FIG. 3A is a view showing an LCD device of the 2-ITO configuration according to the related art.
Figure 3B:
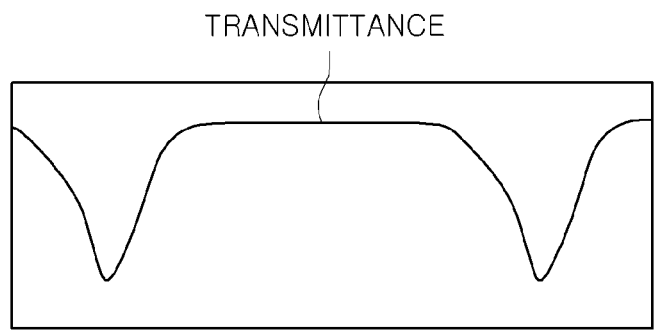
FIG. 3B is a graphic diagram showing light transmittance in by an LCD device of the 2-ITO configuration shown in FIG. 3A.
Figure 4A:
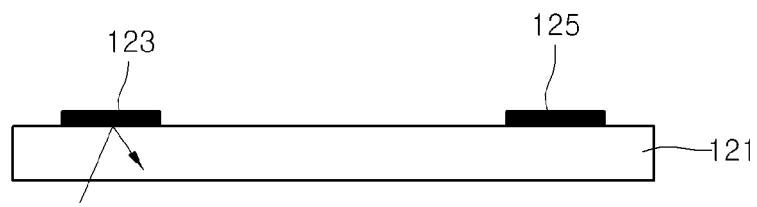
FIG. 4A is a view showing an LCD device of the 2MoTi configuration according to the related art.
Figure 4B:
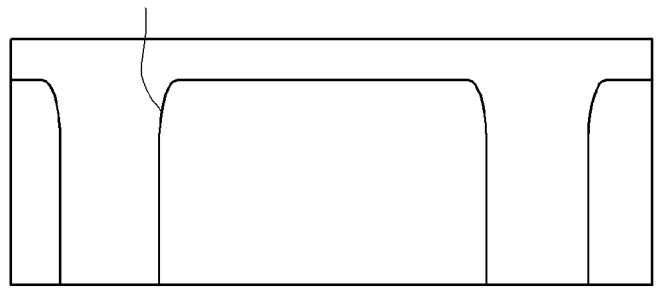
FIG. 4B is a graphic diagram showing light transmittance in an LCD device of the 2Moti configuration shown in FIG. 4A

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 5:
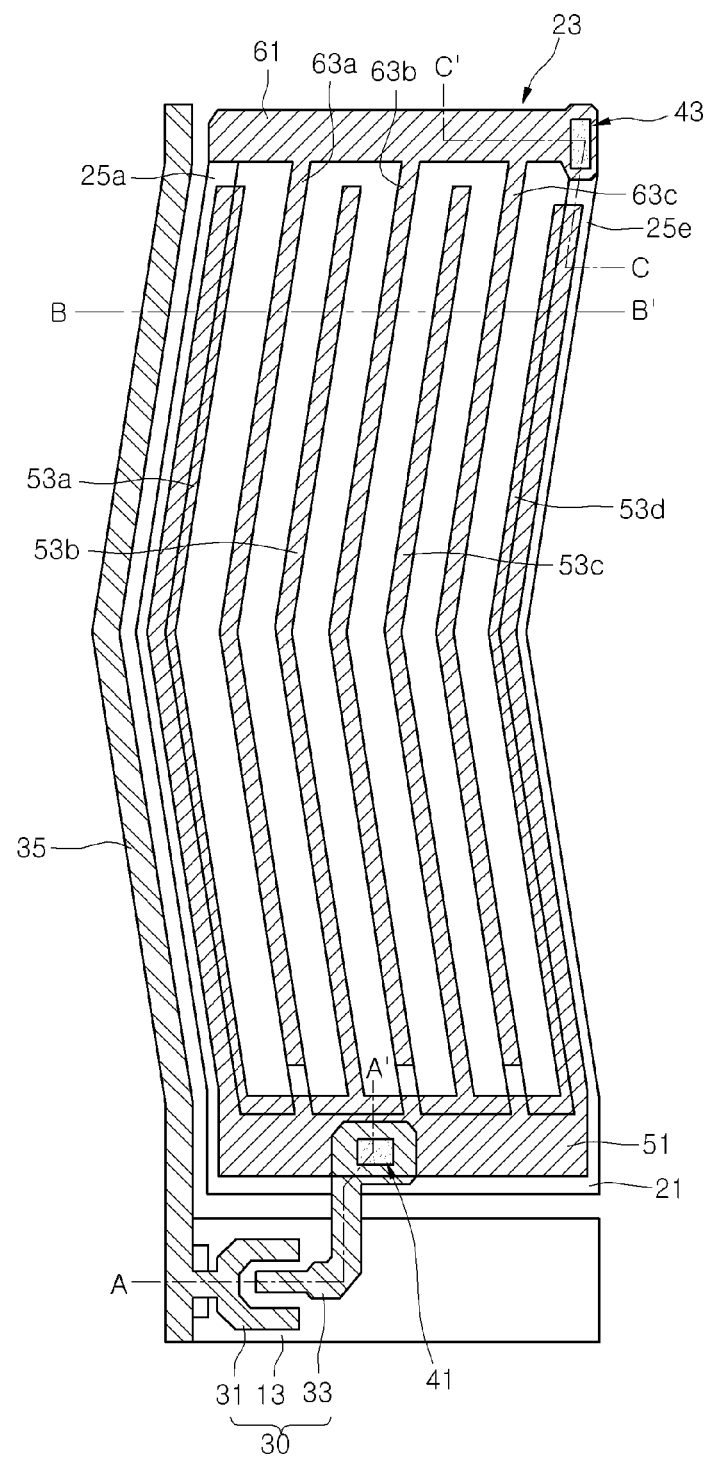
FIG. 5 is a plane view showing an LCD device of an IPS mode according to an embodiment of the present disclosure.
Figure 6:
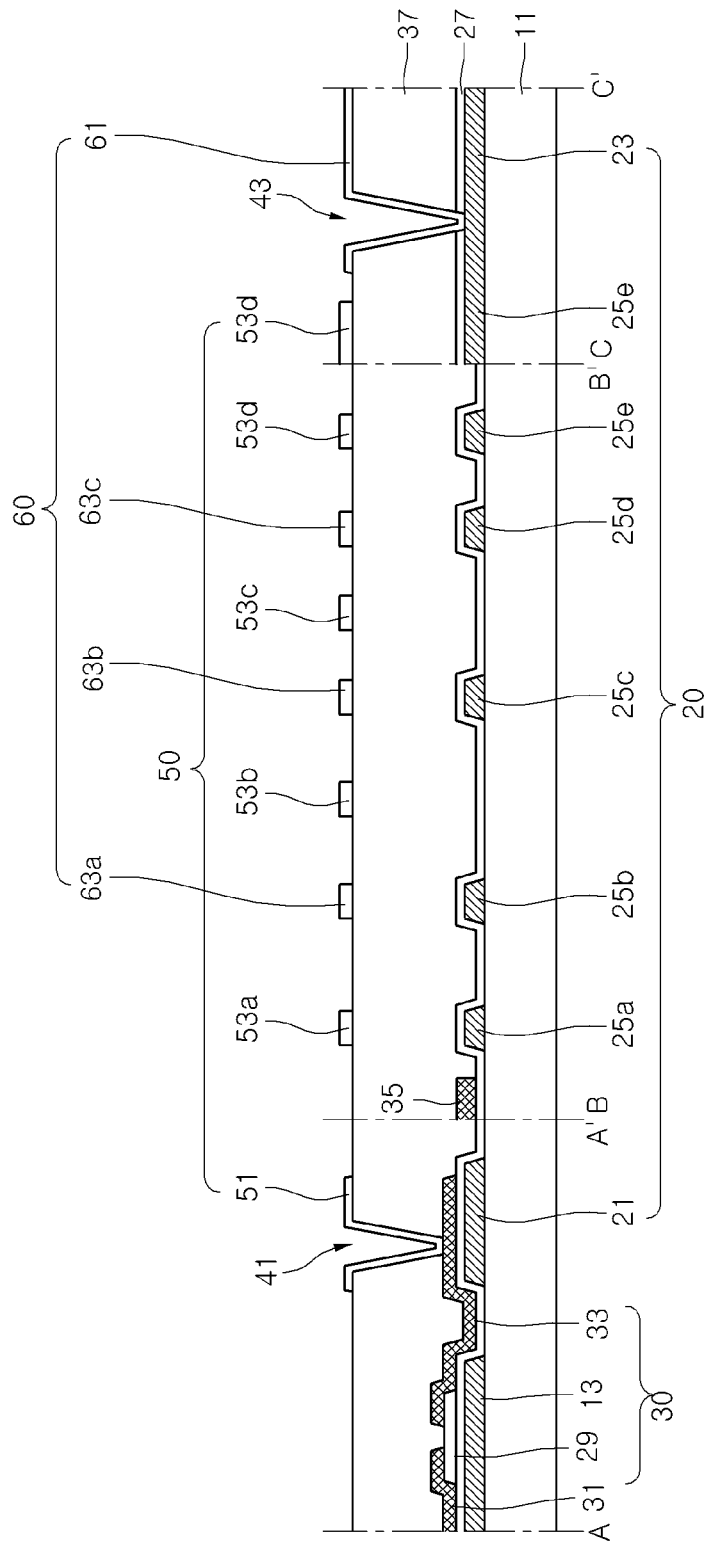
FIG. 6 is a cross-sectional view showing sectional surfaces taken along lines A-A', B-B', and C-C' in the LCD device of an IPS mode shown in FIG. 5.

FIG. 5 is a plane view showing an LCD device of an IPS mode according to an embodiment of the present disclosure. FIG. 6 is a cross-sectional view showing sectional surfaces taken along lines A-A', B-B', and C-C' in the LCD device of an IPS mode shown in FIG. 5. Although FIG. 5 shows only a unit pixel region for the convenience of explanation, the embodiment of the present disclosure is not limited to this. In other words, the embodiment of the present disclosure must be applied to an LCD device in which the unit pixel region shown in FIG is arranged in a matrix.

Referring to FIGS. 5 and 6, a substrate 11 includes a gate line 13 and a first common electrode 20. The gate line 13 may be disposed along a first direction (for example, a horizontal direction). The gate line 13 included in the LCD device of the present embodiment can be used as a gate electrode which is one of the components of a thin film transistor. In other words, the thin film transistor can be formed on the gate line 13.

The first common electrode 20 includes first and second horizontal common electrode bars 21 and 23 arranged to be separated from each other in the first direction, and a plurality of first vertical common electrode bars 25a to 25e extended between the first and second horizontal common electrode bars 21 and 23 in a second direction (for example, a vertical direction). The first horizontal common electrode bar 21 is disposed adjacent to the gate line 13. Meanwhile, the second horizontal common electrode bar 23 is disposed adjacent to a preceding gate line which is positioned in a preceding pixel region ahead of the gate line 13.

The first vertical common electrode bars 25a to 25e may extend from the first horizontal common electrode bar 21 to the second horizontal common electrode bar 23. In other words, the first vertical common electrode bars 25a to 25e connected between the first and second horizontal common electrode bars 21 and 23 are arranged along the second direction (i.e., the vertical direction). The first vertical common electrode bars 25a to 25e can also have a crooked (or curved) shape. Furthermore, the first vertical common electrode bars 25a to 25e can integrally be formed with the first and second horizontal common electrode bars 21 and 23.

The gate line 13 and the first common electrode 20 can include either a single layer formed of one material selected from a group which consists of cooper (Cu), aluminum (Al), Molybdenum (Mo), tungsten (W), titanium (Ti), a cooper alloy, an aluminum alloy, a molybdenum alloy, a tungsten alloy, and a titanium alloy, or a stacked layer formed of at least two selected from the above group.

A gate insulation film 27 is disposed on the entire surface of the substrate with the gate line 13 and the first common electrode 20. The gate insulation film 27 may be formed of an organic material or an inorganic material.

A semiconductor layer 29 including an active layer and an ohmic contact layer is formed on the gate insulation film 27 opposite to the gate line 13. The active layer may be formed of silicon. The ohmic contact layer can be formed by doping an impurity into silicon.

A data line 35 and source/drain electrodes 31 and 33 are arranged on the semiconductor layer 29. The data line 35 is disposed crossing the gate line 13. The source electrode 31 is connected to the data line 35 in a unified manner. The drain electrode 33 is disposed separated from the source electrode 31. The data line 35 and the source/drain electrodes 31 and 33 can be formed of either the same material as the gate line 13 or a material different from the gate line 13. More specifically, the data line 35 and the source/drain electrodes 31 and 33 can include either a single layer formed of one material selected from a group which consists of cooper (Cu), aluminum (Al), Molybdenum (Mo), tungsten (W), titanium (Ti), a cooper alloy, an aluminum alloy, a molybdenum alloy, a tungsten alloy, and a titanium alloy, or a stacked layer formed of at least two selected from the above group. Furthermore, the data line 35 has a crooked (or curved) shape in order to be separated at a fixed distance from vertical pixel electrode bars and second vertical common electrode bars of the second common electrode described below. This is due to the fact that the vertical pixel electrode bars and the second vertical common electrode bars form a crooked shape (or a curved shape).

In this manner, a thin film transistor 30 including the gate line 13, the gate insulation film 27, the semiconductor layer 29, and the source/drain electrodes 31 and 33 can be formed. This thin film transistor 30 is connected to the gate line 13 and the data line 35.

A passivation (or protective) film 37 is formed on the substrate 11 which includes the thin film transistor 30. The passivation film 37 includes a contact hole 41 exposing the drain electrode 33, and a second contact hole 43 exposing the second horizontal common electrode bar 23 of the first common electrode 20.

A pixel electrode 50 and a second common electrode 60 are arranged on the passivation film 37. The pixel electrode 50 and the second common electrode 60 can be formed of the same material as each other and can be arranged on the same layer.

The pixel electrode 50 includes a horizontal electrode bar 51 and a plurality of vertical pixel electrode bars 53a to 53d extending from the horizontal electrode bar 51.

The second common electrode 60 includes a third horizontal common electrode bar 61 and a plurality of second vertical common electrode bars 63a to 63c extending from the third horizontal common electrode bar 61. The second vertical common electrode bars 63a to 63c are arranged to overlap the first vertical common electrode bars 25b to 25d except the first vertical common electrode bars 25a and 25e positioned at the outermost sides. The second vertical common electrode bars 63a to 63c are either equal to or wider than the respective first vertical common electrode bars 25b to 25d. It is preferable for the second vertical common electrode bars 63a to 63c to have a width wider than that of the respective first vertical common electrode bars 25b to 25d.

If a mask is used in the formation of the first common electrode 20, the mask can be misaligned. In this case, the distances between the first vertical common electrode bars 25b to 25d of the first common electrode 20 and the vertical pixel electrode bars 53a to 53d of the pixel electrode 50 are different from each other. Also, the first vertical common electrode bars 25b to 25d of the first common electrode 20 are not overlapped by the second vertical common electrode bars 63a to 63c of the second common electrode 60 but are separated from them. As such, light does not penetrate through the separated regions (or gaps) between the first vertical common electrode bars 25b to 25d of the first common electrode 20 and the second vertical common electrode bars 63a to 63c of the second common electrode 60, due to the opacity of the first vertical common electrode bars 25b to 25d. Light penetrating through the separated regions (or the gaps) is also not affected by an equivalent electric field formed on the first vertical common electrode bars 25b to 25d. In this case, as the separated regions have the same size respectively, distances between the separated region are also identical with each other. Therefore, transmission regions adjacent to each of the vertical pixel electrode bars 53a to 53d have the same light transmittance as each other. Hereinafter, the transmission regions are regions except the separated regions in each pixel. As a result, the transmittance is not lowered.

In addition, the opaque first vertical common electrode bars 25b to 25d of the first common electrode 20 are arranged not to overlap any of the second vertical common electrode bars 63a to 63c. Accordingly, the contrast ratio of the unit pixel region can be improved.

The pixel electrode 50 and the second common electrode 60 can be formed of a transparent conductive material such as ITO (indium tin oxide), IZO (indium zinc oxide), and ITZO (indium tin-zinc oxide). The pixel electrode 50 may be electrically connected to the drain electrode 33 of the thin film transistor 30 through the first contact hole 41. The second common electrode 60 may be electrically connected to the first common electrode 20 through the second contact hole 43. In other words, the third horizontal common electrode bar 61 of the second common electrode 60 can be electrically connected to the second horizontal common electrode bar 23 of the first common electrode 20.

The outermost vertical pixel electrode bars 53a and 53d of the pixel electrode 50 and the outermost first vertical common electrode bars 25a and 25e can configure a storage capacitor together with the passivation film 37 and the gate insulation film 27 which are interposed between them. Also, the horizontal pixel electrode bar 51 of the pixel electrode 50 and the first horizontal common electrode bar 21 of the first common electrode 20 can configure another storage capacitor together with the passivation film 37 and the gate insulation film 27 which are interposed between them. As such, the storage capacitor is formed between the first horizontal common electrode bar 21 and the horizontal pixel electrode bar 51 and between the outermost first vertical common electrode bars 25a and 25e and the outermost vertical pixel electrode bars 53a and 53d. Therefore, the capacitance of the storage capacitor can become larger.

The third horizontal common electrode bar 61 and the horizontal pixel electrode bar 51 can be arranged parallel to the gate line 13. The vertical pixel electrode bars 53a to 53d and the second vertical common electrode bars 63a to 63c can be arranged parallel to the data line 35. Also, the vertical pixel electrode bars 53a to 53d and the second vertical common electrode bars 63a to 63c can have a crooked (curved) shape. The vertical pixel electrode bars 53a to 53d are alternately arranged with the second vertical common electrode bars 63a to 63c.

In this way, the first and second vertical common electrode bars 25a to 25e and 63a to 63c are arranged on the different layers, and the vertical pixel electrode bars 53b and 53c are arranged between the second vertical common electrode bars 63a to 63c. As such, IPS electric fields (or horizontal electric fields) can be induced between the vertical pixel electrode bars 53b and 53c and the first vertical common electrode bars 25b to 25d and between the vertical pixel electrode bars 53b and 53c and the second vertical common electrode bars 63a to 63c.

Figure 7:
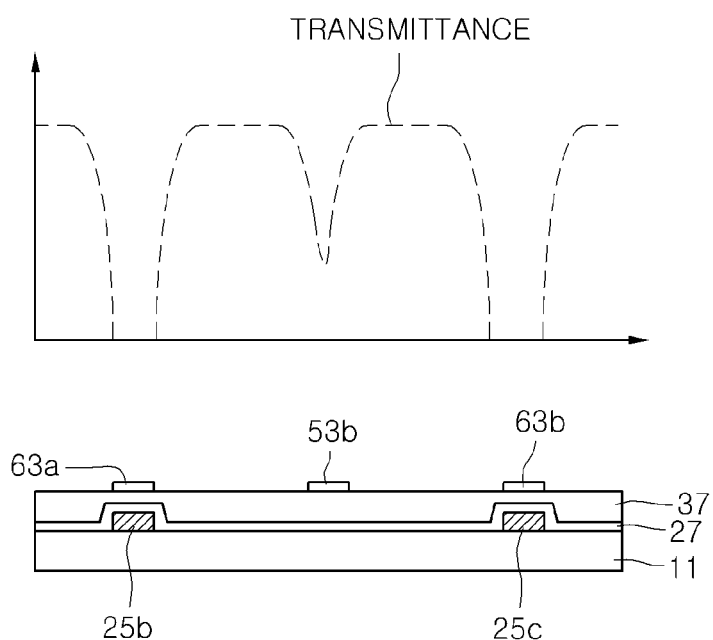
FIG. 7 is a graphic diagram showing light transmittance in the LCD device of an IPS mode shown in FIG. 5.

In addition to this, since the first vertical common electrode bars 25b to 25d formed of an opaque metal material shield light, the light transmittance in the openings (or gaps) between the first vertical common electrode bars 25b to 25d and the vertical pixel electrode bars 53b and 53c become higher, as shown in FIG. 7. Accordingly, the LCD device of the present embodiment can have an improved contrast ratio compared to those of the 1-matal-1-ITO and 2-ITO configurations according to the related art.

Furthermore, the first vertical common electrode bars 25b to 25d and the second vertical common electrode bars 63a to 63c are arranged to overlap each other. As such, the openings between the vertical pixel electrode bars 52b and 53c and one of the first and second vertical common electrode bars 25b to 25d and 63a to 63c may be equal to one another in width, even though the mask is misaligned during the formation of the first common electrode 20. Therefore, the LCD device of the present embodiment can greatly improve the light transmittance in comparison with those of the 1-matal-1-ITO and 2-ITO configurations according to the related art.

Consequently, the LCD device of the present embodiment may have a 1-metal-2-ITO configuration which includes the first common electrode 20 formed of a metal, the pixel electrode 50 of the transparent conductive film, and the second common electrode 60 of the transparent conductive film disposed on the same layer as the pixel electrode 50. It is evident that the 1-metal-2-ITO configuration of the present embodiment can have superior light-transmittance compared to the 1-metal-1-ITO and 2MoTi configurations of the related art, and a contrast ratio higher than those of the 1-metal-1-ITO and 2-ITO configurations according to the related art, as described in the following table 1.

TABLE 1

|  | 1-Metal-1-ITO | 2-ITO | 2MoTi | 1-Metal-2-ITO |
| --- | --- | --- | --- | --- |
| Transmittance | 400.3 | 439.2 | 407.4 | 428.3 |
| Contrast Ratio | 1053 | 1046 | 1164 | 1086 |

Also, DC (direct current) residual image and static electricity characteristics are measured. These measurements show that the 1-metal-2-ITO configuration of the present embodiment is superior to the related art configurations.

FIGS. 8A through 8D are cross-sectional views explaining a method of manufacturing the LCD device of an IPS mode according to an embodiment of the present disclosure. The method of manufacturing the LCD device of an IPS mode according to the present embodiment will now be explained referring to FIGS. 5 and 8A to 8D.

Figure 8A:
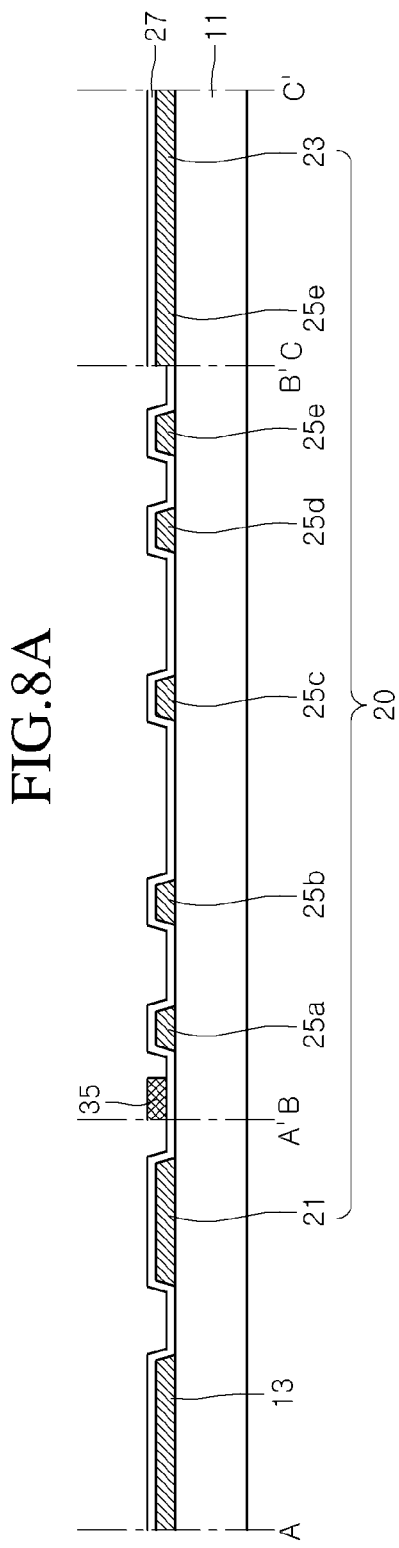
FIGS. 8A through 8D are cross-sectional views explaining a method of manufacturing the LCD device of an IPS mode according to an embodiment of the present disclosure.

As shown in FIG. 8A, a gate line 13 and a first common electrode 20 are formed on a substrate 11 through a process of forming a first metal film on the substrate 11 and patterning the first metal film. The first metal film can include either a single layer formed of one material selected from a group which consists of cooper (Cu), aluminum (Al), Molybdenum (Mo), tungsten (W), titanium (Ti), a cooper alloy, an aluminum alloy, a molybdenum alloy, a tungsten alloy, and a titanium alloy, or a stacked layer formed of at least two selected from the above group. The gate line 13 and the first common electrode 20 may be formed within a pixel region.

The gate line 13 functions as a gate electrode. As such, a thin film transistor, which will be formed thereafter, can be disposed on the gate line 13. The gate line 13 may be formed along a first direction (for example, a horizontal direction).

The first common electrode 20 includes first and second horizontal common electrode bars 21 and 23 separated from each other, and a plurality of first vertical common electrode bars 25a to 25e extended between the first and second horizontal common electrode bars 21 and 23 in such a manner as to be unified with the horizontal common electrode bars 21 and 23. The first horizontal common electrode bar 21 is disposed adjacent to a respective gate line 13. Meanwhile, the second horizontal common electrode bar 23 is disposed adjacent to a preceding gate line which is positioned in a preceding pixel region ahead of the respective gate line 13. The first vertical common electrode bars 25a to 25e between the first and second horizontal common electrode bars 21 and 23 can be formed in a unified manner (i.e., of a single body) with the first and second horizontal common electrode bars 21 and 23. The first vertical common electrode bars 25a to 25e also can have a crooked (or curved) shape. The first and second horizontal common electrode bars 21 and 23 are formed parallel to the gate line 13. The first vertical common electrode bars 25a to 25e are formed extending along a second direction (i.e., a vertical direction) perpendicular to the gate line 13.

On the entire surface of the substrate 11 including the gate line 13, a gate insulation film 27 is formed of either an organic material or an inorganic material.

Figure 8B:
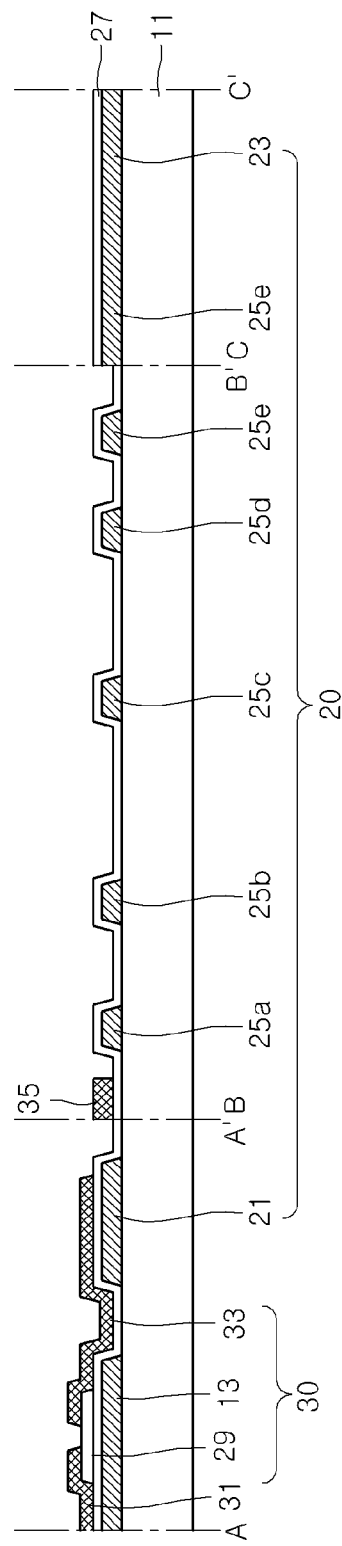

A semiconductor layer 29 including an active layer and an ohmic contact layer is formed on the gate insulation film 27 by forming and then patterning an active film and an ohmic contact film on the gate insulation film 27, as shown in FIG. 8B. The active layer may be formed of silicon. The ohmic contact layer can be formed by doping an impurity into silicon. The semiconductor layer 20 can be formed on the gate line 13.

Figure 8C:
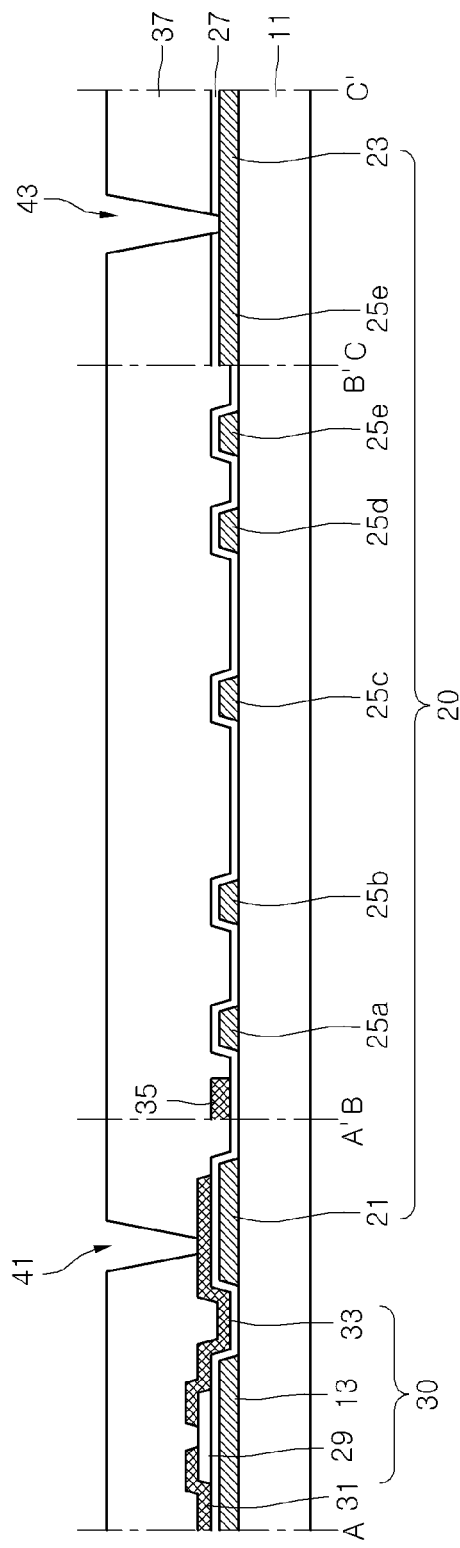

Referring to FIG. 8C, a data line 35 and source/drain electrodes 31 and 33 are formed on the substrate 11 with the semiconductor layer 29, through a process of forming and patterning a second metal film on the substrate. The second metal film can include either a single layer formed of one material selected from a group which consists of cooper (Cu), aluminum (Al), Molybdenum (Mo), tungsten (W), titanium (Ti), a cooper alloy, an aluminum alloy, a molybdenum alloy, a tungsten alloy, and a titanium alloy, or a stacked layer formed of at least two selected from the above group.

The data line 35 is disposed crossing the gate line 13. In other words, the data line 35 is formed along the second direction (i.e., the vertical direction). At the same time, the outermost first vertical common electrode bars 25a and 25e of the first vertical common electrode bars 25a to 25e can be formed adjacent to the data line 35 within the pixel region. The data line 35 can be bent parallel to the first vertical common electrode bars 25a to 25e. In other words, the data line 35 may be formed parallel to the first vertical common electrode bars 25a to 25e. The source electrode 31 is formed in such a manner as to be unified with the data line 35. The drain electrode 33 is disposed separately from the source electrode 31.

In this way, the pixel region is defined by the crossing of the data line 35 and the gate line 13. A thin film transistor 30 including the gate line 13, the gate insulation film 27, the semiconductor layer 29, and the source/drain electrodes 31 and 33 can then be formed.

Then, a passivation (or protective) film 37 is formed, by either coating an organic material or depositing an inorganic mater, on the substrate 11 with the data line 35, as shown in FIG. 8C. The passivation film is patterned to form a first contact hole 41 exposing the drain electrode 33 and a second contact hole 43 exposing the second horizontal common electrode bar 23.

Figure 8D:
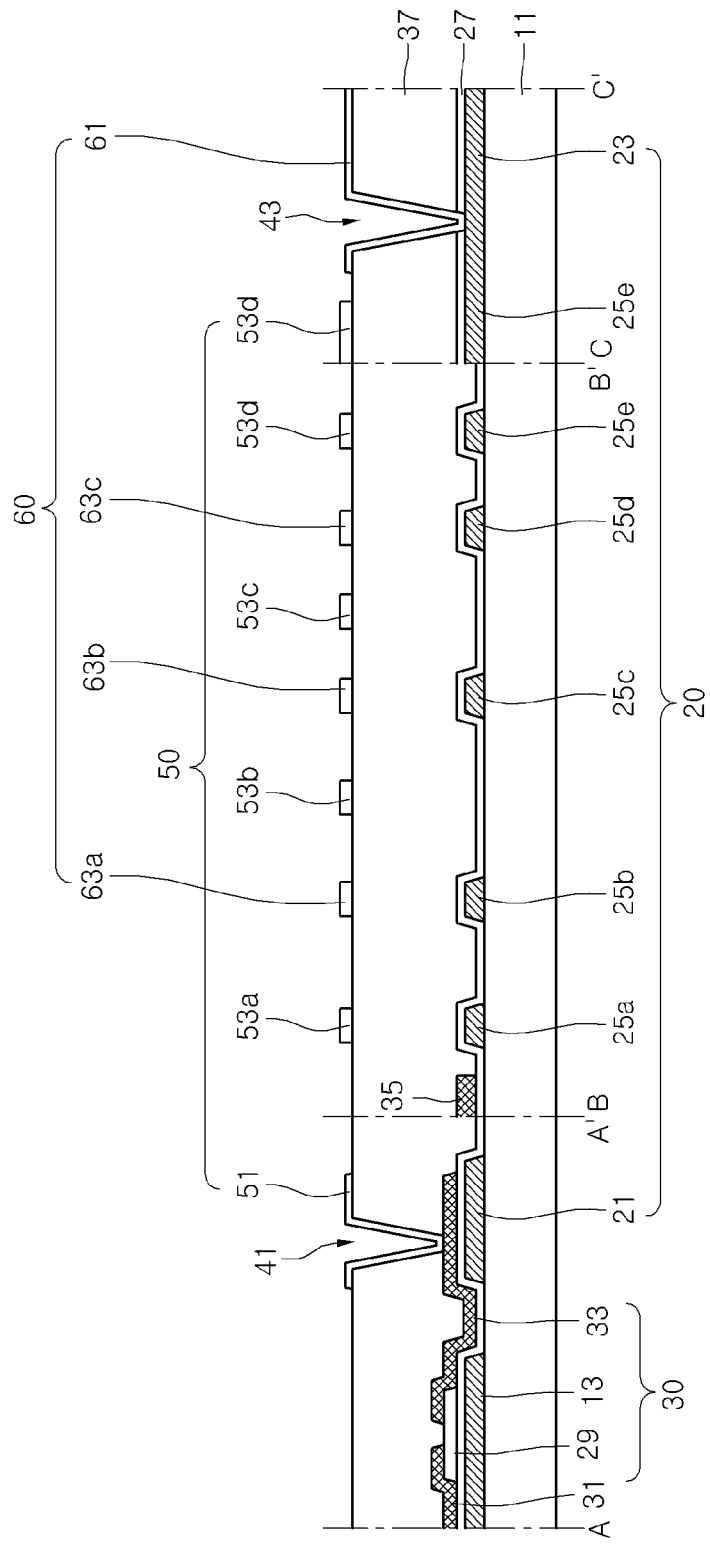

As shown in FIG. 8D, a pixel electrode 50 and a second common electrode 60 are provided on the passivation film 37 by forming and patterning a transparent conductive film on the passivation film 37. The transparent conductive film can be formed of any one of ITO, IZO, and ITZO.

The pixel electrode 50 includes a horizontal electrode bar 51 and a plurality of vertical pixel electrode bars 53a to 53d extending from the horizontal electrode bar 51. The vertical pixel electrode bars 53a to 53d are formed to be unified with the horizontal pixel electrode bar 51. The horizontal pixel electrode bar 51 is electrically connected to the drain electrode 33 of the thin film transistor 30 through the first contact hole 41.

The horizontal electrode bar 51 is formed to overlap the first horizontal common electrode bar 21 adjacent to the gate line 21. As such, the horizontal electrode bar 51 and the first horizontal common electrode bar 21 can form a storage capacitor together with the passivation film 37 and the gate insulation film 27 interposed between them.

The outermost vertical pixel electrode bars 53a and 53d of the vertical pixel electrode bars 53a to 53d also are formed to overlap the outermost first vertical common electrode bars 25a and 25e of the first vertical common electrode bars 25a to 25e within the pixel region. Accordingly, the outermost vertical pixel electrode bars 53a and 53d and the outermost first vertical common electrode bars 25a and 25e can form another storage capacitor together with the passivation film 37 and the gate insulation film 27 interposed between them.

The second common electrode 60 includes a third horizontal common electrode bar 61 and a plurality of second vertical common electrode bars 63a to 63c extending from the third horizontal common electrode bar 61. The plural second vertical common electrode bars 63a to 63c are formed to be unified with the third horizontal common electrode bar 61. The third horizontal common electrode bar 61 is electrically connected to the second horizontal common electrode bar 23 through the second contact hole 43.

The second vertical common electrode bars 63a to 63c can alternately be formed with the vertical pixel electrode bars 53a to 53d. Also, the second vertical common electrode bars 63a to 63c are arranged to overlap the respective first vertical common electrode bars 25b to 25d. To this end, the second vertical common electrode bar 63a to 63c are either equal to or wider than the respective first vertical common electrode bars 25b to 25d. In other words, the second vertical common electrode bars 63a to 63c may be formed in a width great enough to cover the respective first vertical common electrode bars 25b to 25d.

The second vertical common electrode bars 63a to 63c and the vertical pixel electrode bars 53a to 53d can be formed parallel to the data line 35. As such, the second vertical common electrode bars 63a to 63c and the vertical pixel electrode bars 53a to 53d may have curved shapes.

In this matter, the LCD device of the present embodiment forms the first and second common electrodes 20 and 60, which are electrically connected to each other, on different layers. The LCD device also forms the pixel electrode 50 on the same layer as the second common electrode 60. Furthermore, the LCD device forms the first vertical common electrode bars 25b to 25d of the first common electrode 20 and the second vertical common electrode bars 63a to 63c of the second common electrode 60 to overlap each other. As such, the openings between the vertical pixel electrode bars 53b and 53c of the pixel electrode 50 and one group of the first vertical common electrode bars 25b to 25d of the first common electrodes 20 and the second vertical common electrode bars 63a to 63c of the second common electrode 60 may be equal to one another in width, even though the first common electrode 20 is shifted toward any one side due to mis-alignment of the mask. Accordingly, the light transmittances in the openings are all the same. As a result, the LCD device of the present embodiment can greatly improve the light transmittance.

In addition, since the opaque first common electrode 20 is formed to overlap the second common electrode 60, it shields light. Therefore, the light transmittance in the openings (or gaps) becomes higher. Accordingly, the LCD device of the present embodiment can improve the contrast ratio.

On the other hand, the first common electrode 20 can be formed in a stacked layer of at least two metal materials. For example, the first common electrode 20 can be formed in a double layer of MoTi/Cu. In this case, the first common electrode 20 of the stacked layer causes step coverage in different layers formed on the first common electrode 20, thereby misaligning liquid crystal during a rubbing process. Therefore, a light leakage phenomenon is generated.

Figure 9:
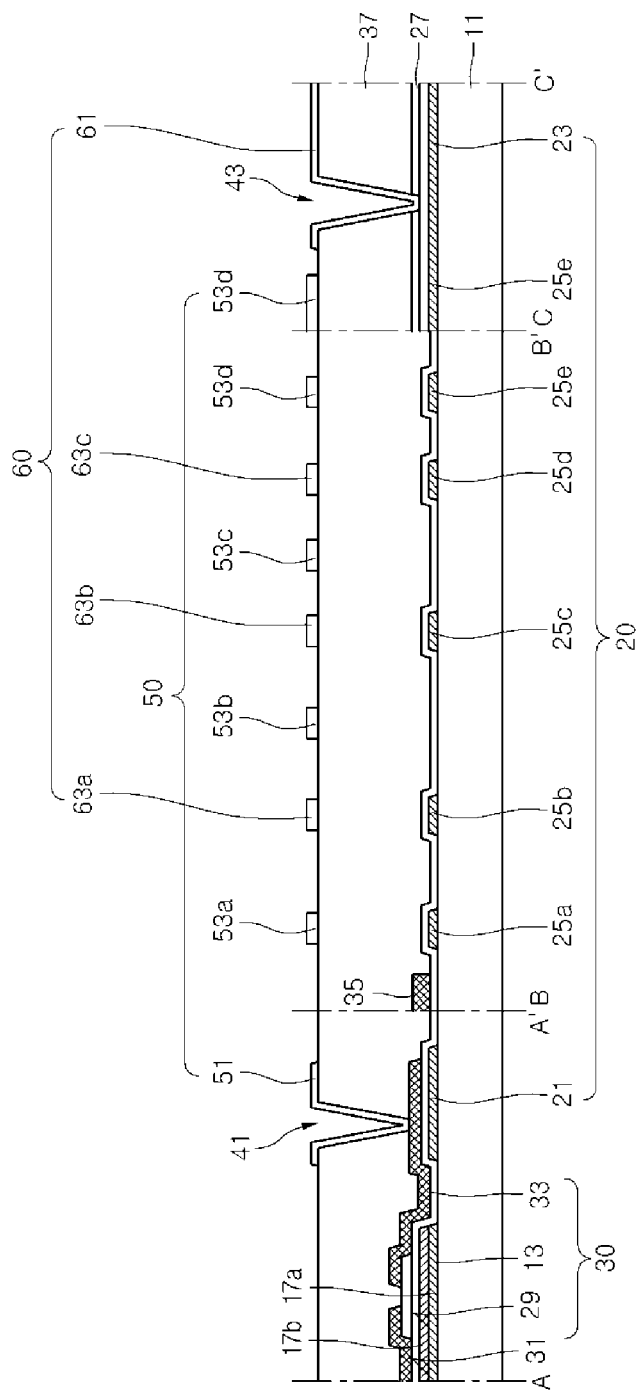
FIG. 9 is a plane view showing an LCD device of an IPS mode according to another embodiment of the present disclosure.

To address this matter, as shown in FIG. 9, a gate line 13 includes first and second layers 17a and 17b, and a first horizontal electrode bar 21, a second horizontal electrode bar 23 (refer to FIG. 5) and a plurality of first vertical common electrode bars 25a to 25e include the first layer 17a, respectively. For instance, the first layer 17a may be formed of MoTi and the second layer 17b may be formed of Cu. The first and second layers 17a and 17b are formed on a substrate 11. Then, the second layer 17b is removed to form the first horizontal electrode bar 21, the second horizontal electrode bar 23 (refer to FIG. 5) and the plurality of first vertical common electrode bars 25a to 25e. Thus the first common electrode 20 is of a greatly reduced thickness. As such, the step coverage caused by the first common electrode 20 may be minimized and the liquid crystal may be uniformly aligned. Accordingly, the light leakage phenomenon can be prevented.

As described above, the LCD device according to an embodiment of the present disclosure enables the openings between the pixel electrode bars of the pixel electrode and one of the first common electrode bars of the first common electrodes and the second common electrode bars of the second common electrode to be equal to one another in width, even though the first common electrode is shifted toward one side during the misalignment of the mask. Therefore, the light transmittances in the openings are all the same. As a result, the LCD device of the present embodiment can greatly improve the light transmittance.

Also, since the opaque first common electrode is formed to overlap the second common electrode, it shields light, making the light transmittance in the openings (or gaps) higher. Accordingly, the LCD device of the present embodiment can improve the contrast ratio.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A liquid crystal display device comprising:
a gate line disposed along a first direction;
a data line crossing the gate line along a second direction;
a thin film transistor disposed on the gate line and connected to the gate line and the data line;
a first common electrode disposed on the same layer as the gate line and including first and second horizontal electrode bars and a plurality of first vertical common electrode bars extended between the first and second horizontal electrode bars, the first horizontal electrode bar disposed adjacent to the gate line;
a second common electrode disposed on a layer different from the first common electrode and including a third horizontal common electrode bar and a plurality of second vertical common electrode bars; and a pixel electrode disposed on the same layer as the second common electrode and including a horizontal pixel electrode bar and a plurality of vertical pixel electrode bars alternately arranged with the plurality of second vertical common electrode bars, wherein an entire region of the second horizontal electrode bar of the first common electrode overlap the third horizontal electrode bar of the second common electrode, wherein the third horizontal electrode bar of the second common electrode and the horizontal pixel electrode bar of the pixel electrode are disposed on the same layer, wherein the outermost first vertical common electrode bars of the first common electrode overlap the corresponding outermost vertical pixel electrode bars of the pixel electrode, respectively to form a storage capacitor, and wherein the remaining first vertical common electrode bars of the first common electrode between the outermost first vertical common electrode bars each entirely overlap with each corresponding one of the second vertical common electrode bars of the second common electrode along a lengthwise direction of the second vertical common electrode bars.

2. The liquid crystal display device according to claim 1, wherein the second vertical common electrode bars are arranged to overlap the first vertical common electrode bars, respectively.

3. The liquid crystal display device according to claim 2, wherein the second vertical common electrode bars have at least width larger than the respective first vertical common electrode bars.

4. The liquid crystal display device according to claim 1, wherein the third horizontal common electrode bar of the second common electrode is connected to the second horizontal common electrode bar of the first common electrode.

5. The liquid crystal display device according to claim 1, wherein the horizontal pixel electrode bar and the first horizontal common electrode bar overlap together with a passivation film and a gate insulation film interposed therebetween to form another storage capacitor.

6. The liquid crystal display device according to claim 1, wherein the vertical pixel electrode bars and the first and second vertical common electrode bars have crooked (or curved or bent) shapes.

7. The liquid crystal display device according to claim 1, wherein the gate line include first and second layers and the first common electrode include the first layer.

8. A method of manufacturing a liquid crystal display device, the method comprising:

forming a gate line and a first common electrode, which includes first and second horizontal common electrode bars and a plurality of first vertical common electrode bars, on a substrate;

forming an gate insulation film on the substrate including the gate line;

forming a semiconductor layer on the gate insulation film opposite to the gate line;

forming a data line and source/drain electrodes on the substrate including the semiconductor layer;

forming a passivation film, which includes a contact hole exposing the second horizontal common electrode bar, on the substrate including the data line; and forming a pixel electrode, which includes a horizontal pixel electrode bar and a plurality of vertical pixel electrode bars, and a second common electrode which includes a third horizontal common electrode bar and a plurality of second vertical common electrode bars alternately arranged with the plurality of vertical pixel electrode bars, on the passivation film, wherein an entire region of the second horizontal electrode bar of the first common electrode overlap the third horizontal electrode bar of the second common electrode, wherein the third horizontal electrode bar of the second common electrode and the horizontal pixel electrode bar of the pixel electrode are disposed on the same layer, wherein the outermost first vertical common electrode bars of the first common electrode overlap the corresponding outermost vertical pixel electrode bars of the pixel electrode, respectively to form a storage capacitor, and wherein the remaining first vertical common electrode bars of the first common electrode between the outermost first vertical common electrode bars each entirely overlap with each corresponding one of the second vertical common electrode bars of the second common electrode along a lengthwise direction of the second vertical common electrode bars.

9. The method according to claim 8, wherein the second common electrode is formed to overlap the first common electrode.

10. The method according to claim 8, wherein the second vertical common electrode bars are formed to overlap the first vertical common electrode bars, respectively.

11. The method according to claim 10, wherein the second vertical common electrode bars have at least width larger than the respective first vertical common electrode bars.

12. The method according to claim 8, wherein the horizontal pixel electrode bar and the first horizontal common electrode bar overlap together with a passivation film and a gate insulation film interposed therebetween to form another storage capacitor.

13. The liquid crystal display device according to claim 1, wherein the third horizontal common electrode bar is connected to the second horizontal common electrode bar through a contact hole.

14. The liquid crystal display device according to claim 1, wherein openings between the plurality of vertical pixel electrode bars and one of the plurality of first vertical common electrode bars and the plurality of second vertical common electrode bars are equal to one another in width.

15. The method according to claim 8, wherein openings between the plurality of vertical pixel electrode bars and one of the plurality of first vertical common electrode bars and the plurality of second vertical common electrode bars are equal to one another in width.

* * * * *